(12) United States Patent
Yamada et al.

(10) Patent No.: US 11,581,252 B2
(45) Date of Patent: Feb. 14, 2023

(54) SEMICONDUCTOR MODULE AND WIRE BONDING METHOD

(71) Applicant: Fuji Electric Co., Ltd., Kanagawa (JP)

(72) Inventors: Takafumi Yamada, Nagano (JP); Kohei Yamauchi, Aachen (DE); Tatsuhiko Asai, Tokyo (JP); Hiromichi Gohara, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 57 days.

(21) Appl. No.: 17/188,221

(22) Filed: Mar. 1, 2021

(65) Prior Publication Data
US 2021/0287978 A1    Sep. 16, 2021

(30) Foreign Application Priority Data

Mar. 13, 2020    (JP) .............................. JP2020-043932

(51) Int. Cl.
*H01L 25/07*    (2006.01)
*H01L 23/498*    (2006.01)
(Continued)

(52) U.S. Cl.
CPC .... *H01L 23/49844* (2013.01); *H01L 23/5386* (2013.01); *H01L 24/05* (2013.01);
(Continued)

(58) Field of Classification Search
CPC ........... H01L 23/49844; H01L 23/5386; H01L 24/05; H01L 24/45; H01L 25/072; H01L 25/18; H01L 2924/13055; H01L 2924/13091; H01L 23/053; H01L 23/24; H01L 24/29; H01L 24/32; H01L 24/40; H01L 24/73; H01L 24/48; H01L 24/35; H01L 24/41; H01L 24/49; H01L 24/85; H01L 24/92; H01L 24/37; H01L 24/83; H01L 2224/05554; H01L 2224/0603;
(Continued)

(56) References Cited

U.S. PATENT DOCUMENTS

| | | |
|---|---|---|
| 2011/0089563 A1 | 4/2011 | Kikuchi et al. |
| 2017/0006721 A1 | 1/2017 | Soyano |
| 2020/0185359 A1 | 6/2020 | Nakashima et al. |

FOREIGN PATENT DOCUMENTS

| | | |
|---|---|---|
| JP | H3-232246 A | 10/1991 |
| JP | 2003-303845 A | 10/2003 |

(Continued)

*Primary Examiner* — Elias Ullah
(74) *Attorney, Agent, or Firm* — Chen Yoshimura LLP

(57) ABSTRACT

A semiconductor module includes at least two semiconductor elements connected in parallel; a control circuit board placed between the at least two semiconductor elements; a control terminal for external connection; a first wiring member that connects the control terminal and the control circuit board; and a second wiring member that connects a control electrode of one of the at least two semiconductor elements and the control circuit board, wherein the second wiring member is wire-bonded from the control electrode towards the control circuit board, and has a first end on the control electrode and a second end on the control circuit board, the first end having a cut end face facing upward normal to a surface of the control electrode and the second end having a cut end face facing sideways parallel to a surface of the control circuit board.

8 Claims, 5 Drawing Sheets

(51) Int. Cl.
  *H01L 23/538* (2006.01)
  *H01L 23/00* (2006.01)
  *H01L 25/18* (2023.01)
(52) U.S. Cl.
  CPC ............ *H01L 24/45* (2013.01); *H01L 25/072* (2013.01); *H01L 25/18* (2013.01); *H01L 2924/13055* (2013.01); *H01L 2924/13091* (2013.01)
(58) Field of Classification Search
  CPC . H01L 2224/29101; H01L 2224/32225; H01L 2224/352; H01L 2224/37124; H01L 2224/37147; H01L 2224/3716; H01L 2224/40225; H01L 2224/4103; H01L 2224/45014; H01L 2224/45015; H01L 2224/45124; H01L 2224/45144; H01L 2224/45147; H01L 2224/48091; H01L 2224/48227; H01L 2224/48472; H01L 2224/49171; H01L 2224/49175; H01L 2224/73263; H01L 2224/73265; H01L 2224/73271; H01L 2224/83801; H01L 2224/8384; H01L 2224/85181; H01L 2924/10253; H01L 2924/10272; H01L 2924/1033; H01L 2924/1203; H01L 2924/1305; H01L 2924/181; H01L 2924/19107

See application file for complete search history.

(56) References Cited

FOREIGN PATENT DOCUMENTS

| | | |
|---|---|---|
| JP | 2011-86766 A | 4/2011 |
| JP | 2017-17195 A | 1/2017 |
| JP | 2017-107937 A | 6/2017 |
| WO | 2019/044748 A1 | 3/2019 |

S1 Prepare semiconductor element 3, circuit board 26, and control terminal 14

S2 Connect the control terminal 14 and the circuit board 26 via first wiring member W1

S3 Connect control electrode 30 of semiconductor element 3 and the circuit board 26 via second wiring member W2

FIG. 5

SEMICONDUCTOR MODULE AND WIRE BONDING METHOD

BACKGROUND OF THE INVENTION

Technical Field

The present invention relates to a semiconductor module and a wire bonding method therefor.

Background Art

A semiconductor device that has a substrate provided with semiconductor elements, such as an IGBT (Insulated Gate Bipolar Transistor), a power MOSFET (Metal Oxide Semiconductor Field Effect Transistor), and/or an FWD (Free Wheeling Diode), is used for an inverter device or the like.

In such a semiconductor device, the surface electrodes of the semiconductor element and the circuit pattern on the substrate are electrically connected by bonding wires. As a wire bonding method of this type, for example, Patent Documents 1-3 disclose so-called stitch bonding in which bonding is continuously performed at a plurality of bonding points without cutting the wire at each bonding point.

RELATED ART DOCUMENT

Patent Document

Patent Document 1: PCT International Publication No. 2019/044748
Patent Document 2: Japanese Patent Application Laid-Open Publication No. 2017-107937
Patent Document 3: Japanese Patent Application Laid-Open Publication No. H3-232246

SUMMARY OF THE INVENTION

In the above-mentioned semiconductor device, for example, a circuit pattern may be arranged between two semiconductor elements arranged side-by-side, and the surface electrodes of the two semiconductor elements may be continuously stitch-bonded via the circuit pattern. In this case, stitch bonding is performed in the order of on one semiconductor element, on the circuit pattern, and on the other semiconductor element. That is, the bonding start position is on one semiconductor element, and the bonding end position is on the other semiconductor element. In such a semiconductor device, stress is concentrated on the joint portions of the wire as the semiconductor device is operated, and there is a possibility that cracks may develop starting from the joint portions.

The present invention has been devised in view of the above consideration, and an object of the present invention is to provide a semiconductor module and a wire bonding method capable of suppressing cracks in the vicinity of a wire bonding portion and extending the service life of the semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor module, comprising: at least two semiconductor elements connected in parallel; a control circuit board placed between the at least two semiconductor elements; a control terminal for external connection; a first wiring member that connects the control terminal and the control circuit board; and a second wiring member that connects a control electrode of one of the at least two semiconductor elements and the control circuit board, wherein the second wiring member is wire-bonded from the control electrode towards the control circuit board, and has a first end on the control electrode and a second end on the control circuit board, the first end having a cut end face facing upward normal to a surface of the control electrode and the second end having a cut end face facing sideways parallel to a surface of the control circuit board.

In another aspect, the present invention provides a method of wire bonding a semiconductor module that includes at least two semiconductor elements connected in parallel, a control circuit board arranged between the two semiconductor elements, and a control terminal for external connection, the method comprising: connecting the control terminal and the control circuit board with a first wiring member; and connecting a control electrode of one of the at least two semiconductor elements and the control circuit board by a second wiring member, wherein the connecting of the control electrode and the control circuit board by the second wiring member includes: staring wire-bonding of the second wiring member on the control electrode, forming a convex curve shape of the second wiring member extending from on the control electrode towards the control circuit board, and thereafter, ending the wire-bonding of the second wiring member on the control circuit board.

According to the present invention, it is possible to suppress cracks in the vicinity of the wire bonding portion and extend the service life of the device.

It is to be understood that both the foregoing general description and the following detailed description are exemplary and explanatory, and are intended to provide further explanation of the invention as claimed.

BRIEF DESCRIPTION OF THE DRAWINGS

FIG. 5 is a flowchart showing a wire bonding method according to an embodiment of the present invention.

DETAILED DESCRIPTION OF EMBODIMENTS

Figure 1:
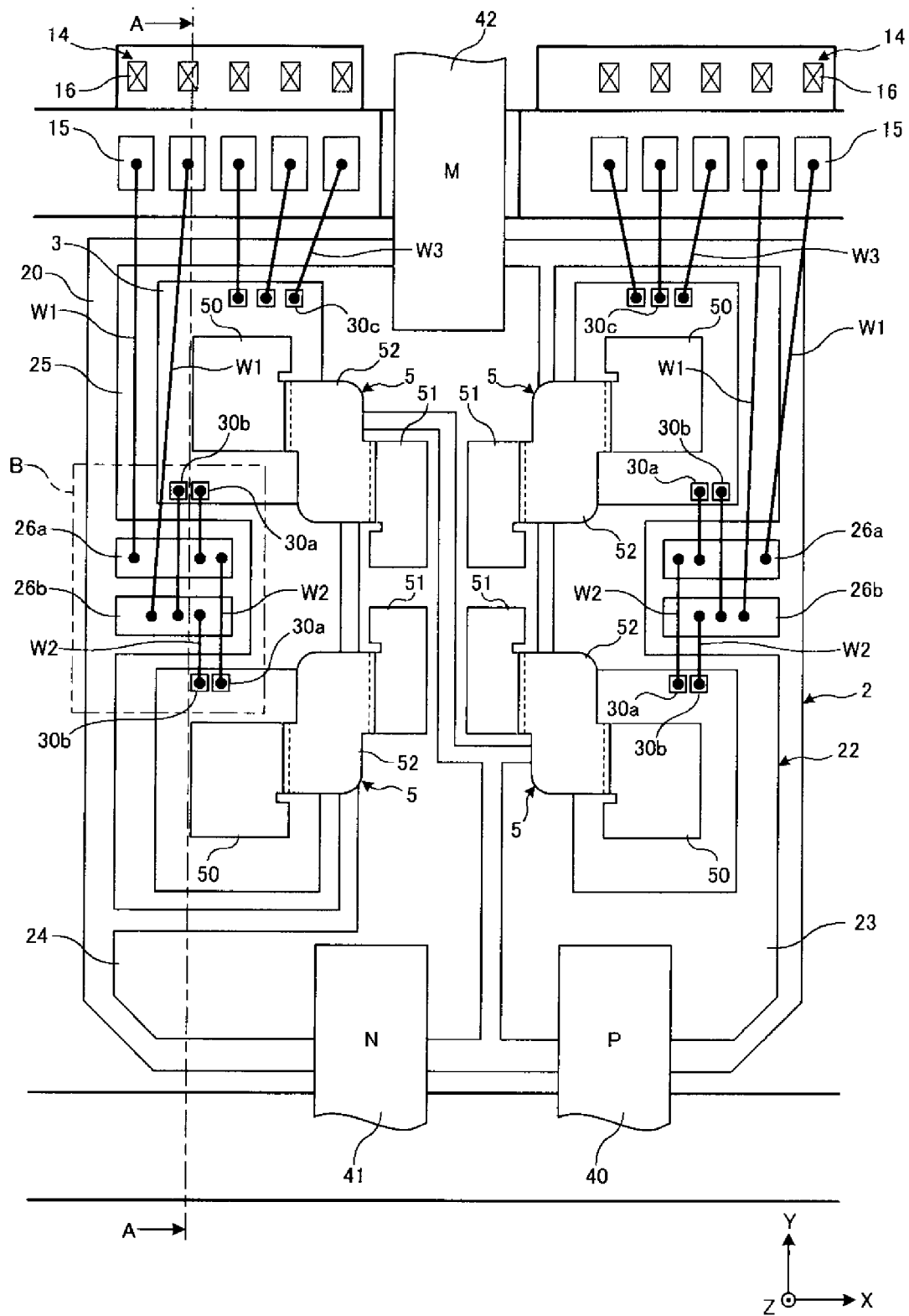
FIG. 1 is a main part plan view of a semiconductor module according to an embodiment of the present invention.
Figure 2:
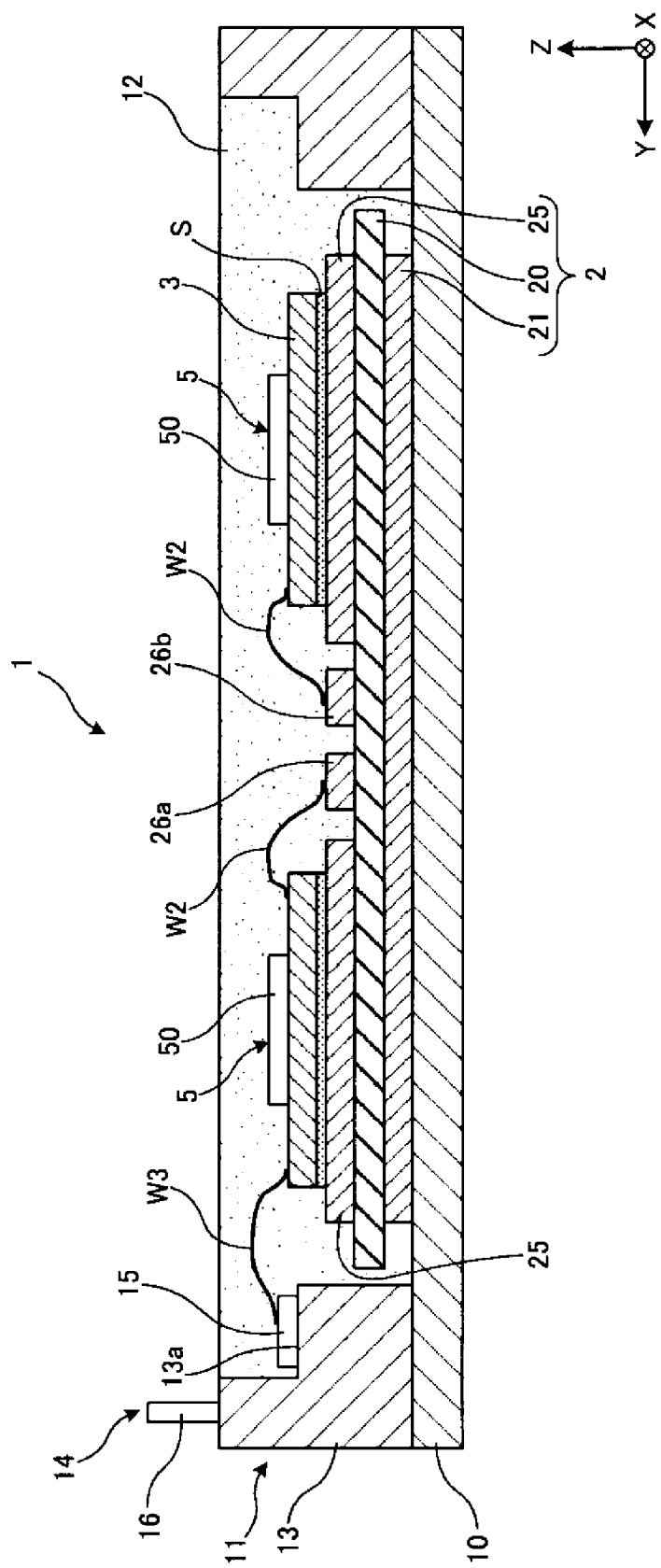
FIG. 2 is a cross-sectional view of the semiconductor module taken along the line A-A of FIG. 1.

Hereinafter, the semiconductor module to which the present invention can be applied will be described. FIG. 1 is a plan view of a semiconductor module according to the present embodiment. FIG. 2 is a cross-sectional view of the semiconductor module shown in FIG. 1 taken along the line A-A of FIG. 1. The semiconductor module explained here is merely an example, and can be changed as appropriate without being limited to this.

Further, in the following figures, the longitudinal direction of the semiconductor module is defined as the X direction, the shorter direction is defined as the Y direction, and the height direction is defined as the Z direction. The longitudinal direction may be, for example, a direction in which a plurality of laminated substrates are lined up. The illustrated X, Y, and Z axes are orthogonal to each other and form a right-handed system. In some cases, the X direction may be referred to as a left-right direction, the Y direction may be referred to as a front-rear direction, and the Z direction may be referred to as a vertical direction. These directions (front-back, left-right, up-down directions) are terms used for convenience of explanation, and the correspondence with each of the XYZ directions may change depending on the mounting posture of the semiconductor device. For example, the heat dissipation surface side (cooler side) of the semiconductor module is referred to as the lower surface side, and the opposite side is referred to as the upper surface side. Further, in the present specification, the plan view means a case where the upper surface of the semiconductor module is viewed from the positive side in the Z direction.

The semiconductor module according to the present embodiment is applied to, for example, a power conversion apparatus, and may be a 6-in-1 type power module constituting an inverter circuit, for example. The power module includes, for example, three semiconductor assemblies that form a U-phase, a V-phase, and a W-phase, respectively. The three semiconductor assemblies each include, for example, a laminated substrate 2 and semiconductor elements 3, and are arranged side by side in the X direction, and the entire semiconductor device has a rectangular shape in a plan view. FIG. 1 shows a plan view around one of the three semiconductor assemblies (for example, V phase).

As shown in FIGS. 1 and 2, the semiconductor module 1 includes a base plate 10, laminated substrates 2 arranged on the base plate 10, a plurality of semiconductor elements 3 arranged on the laminated substrates 2, a case member 11 that houses the laminated substrates 2 and the plurality of semiconductor elements 3, and a sealing resin 12 that is filled inside the case member 11.

The base plate 10 is a rectangular plate having an upper surface and a lower surface. The base plate 10 functions as a heat radiating plate. Further, the base plate 10 has a rectangular shape in a plan view long in the X direction. The base plate 10 is, for example, a metal plate made of copper, aluminum, an alloy thereof, or the like, and the surface thereof may be plated.

A frame-shaped case member 11 is arranged on the upper surface of the base plate 10. The case member 11 is formed of, for example, a synthetic resin and is joined to the upper surface of the base plate 10 via an adhesive (not shown). The case member 11 has a rectangular shape along the outer shape of the base plate 10, and has a frame-shaped wall portion 13 having an opening formed inside. The frame-shaped wall portion 13 is formed so as to rise in the Z direction. The case member 11 defines a space for accommodating the laminated substrates 2, the semiconductor elements 3, and the sealing resin 12.

On the inner peripheral side of the upper surface of the frame-shaped wall portion 13, a stepped portion 13a lowered from the top by one step is formed. The upper surface of the step portion 13a is provided at a position lower than the upper surface of the frame-shaped wall portion 13. A plurality of terminal members 14 (control terminals) for external connection are provided on the frame-shaped wall portion 13.

Specifically, among a pair of wall portions facing each other in the lateral direction (Y direction) of the frame-shaped wall portion 13, a plurality of terminal members 14 are integrally molded in the wall portion on the positive side in the Y direction. Each terminal member 14 is formed by bending a plate-like member made of a metal material such as a copper material, a copper alloy material, an aluminum alloy material, or an iron alloy material. Each terminal member 14 has an inner terminal portion 15 exposed on the upper surface of the step portion 13a and an outer terminal portion 16 protruding on the upper surface of the frame-shaped wall portion 13. As described below, the end of a wiring member is connected to the inner terminal portion 15.

Further, on the inner side of the frame-shaped wall portion 13, the laminated substrate 2 is arranged on the upper surface of the base plate 10. The laminated substrate 2 is formed by laminating metal layers and an insulating layer, and is composed of, for example, a DCB (Direct Copper Bonding) substrate, an AMB (Active Metal Brazing) substrate, or a metal base substrate. The laminated substrate 2 includes an upper surface and a lower surface opposite to the upper surface. Specifically, the laminated substrate 2 has an insulating plate 20, a heat radiating plate 21 arranged on the lower surface of the insulating plate 20, and a plurality of circuit boards 22 (23, 24, 25) arranged on the upper surface of the insulating plate 20. The laminated substrate 2 is formed, for example, in a substantially rectangular shape in a plan view.

The insulating plate 20 has a predetermined thickness in the Z direction and is formed in a flat plate shape having an upper surface and a lower surface. The insulating plate 20 is formed of, for example, a ceramic material, such as alumina ($Al_2O_3$), aluminum nitride (AlN), silicon nitride ($Si_3N_4$), a resin material such as epoxy, or an insulating material such as an epoxy resin material using the ceramic material as a filler. The insulating plate 20 may be called an insulating layer or an insulating film.

The heat radiating plate 21 has a predetermined thickness in the Z direction and is formed on the lower surface of the insulating plate 20. The heat radiating plate 21 is formed of a metal plate having good thermal conductivity such as copper or aluminum.

On the upper surface (main surface) of the insulating plate 20, a plurality of circuit plates 22 are each formed in an island shape in a state of being electrically insulated from each other. Specifically, the plurality of circuit boards 22 include a first circuit board 23 connected to a positive potential point (P terminal 40), a second circuit board 24 connected to a negative potential point (N terminal 41), and a third circuit board 25 connected to a point of an intermediate potential (M terminal 42). These circuit boards 22 (23, 24, 25) are composed of a metal layer having a predetermined thickness formed of copper foil or the like.

The first circuit board 23 has a rectangular shape in a plan view extending in the Y direction along one side of the laminated substrate 2 on one side (positive side) in the X direction. The first circuit board 23 is slightly cut out from the outside to the inside in the X direction at substantially the center in the Y direction. In the cut out portion, a gate pad 26a and an emitter pad 26b are formed side by side in the Y direction as control circuit boards. In FIG. 1, the gate pad 26a is located on the upper side of the paper surface (on the positive side in the Y direction).

The second circuit board 24 has a long portion extending in the Y direction at substantially the center of the laminated substrate 2 in the X direction, and has a substantially L-shape in a plan view in which one end on the negative side in the Y direction is bent in the negative X direction.

The third circuit board 25 extends in the Y direction along one side of the laminated substrate 2 on the other side (negative side) in the X direction, and is bent so as to be folded back at the other end on the positive side in the Y direction of the second circuit board 24. The second circuit board 24 has a substantially U-shaped plan view extending in the negative Y direction so as to sandwich the second circuit board 24 in the X direction. The third circuit board 25 is slightly cut out from the outside to the inside in the X direction at substantially the center in the Y direction. In the cut out portion, a gate pad 26a and an emitter pad 26b are formed side by side in the Y direction. The gate pad 26a is located on the upper side of the paper surface (on the positive side in the Y direction).

A plurality of semiconductor elements 3 are arranged at predetermined positions on the upper surface of the circuit boards 22 via a bonding material S (see FIG. 2) such as solder. Each semiconductor element 3 is formed of a semiconductor substrate made of semiconductor, such as silicon (Si), silicon carbide (SiC), or gallium nitride (GaN), and has a rectangular shape in a plan view, for example. Each semiconductor element 3 includes an upper surface and a lower surface opposite to the upper surface. In the present embodiment, each semiconductor element 3 is an RC (Reverse Conducting)-IGBT element in which an IGBT element and an FWD are formed and integrated in a semiconductor substrate.

The semiconductor element 3 is not limited to this, and may be configured by combining a switching element such as an IGBT, a power MOSFET, a BJT (Bipolar junction transistor), and a diode such as an FWD. Further, as the semiconductor element 3, an RB (Reverse Blocking)-IGBT or the like having a sufficient withstand voltage against reverse bias may be used. In addition, the shape, number of arrangements, arrangement locations, and the like of the semiconductor elements 3 can be changed as appropriate.

In this embodiment, four semiconductor elements 3 are arranged for each phase. Specifically, the two semiconductor elements 3 arranged on the upper surface of the first circuit board 23 form the upper arm of the inverter circuit. In the upper arm, the two semiconductor elements 3 are electrically connected in parallel and arranged side by side in the Y direction. Further, the two semiconductor elements 3 arranged on the upper surface of the third circuit board 25 form a lower arm. In the lower arm, the two semiconductor elements 3 are electrically connected in parallel and arranged side by side in the Y direction. In this way, the upper arm and the lower arm are arranged side by side in the X direction on the upper surface of the laminated substrate 2. Further, the chip mounting portion of the first circuit board 23, the wiring member connecting portion of the third circuit board 25, the second circuit board 24, and the chip mounting portion of the third circuit board 25 are arranged in this order from the positive side in the X direction toward the negative side in the X direction.

In these semiconductor elements 3, the semiconductor substrate may have a first surface and a second surface opposite to the first surface, the first surface having an emitter, a source, or an anode electrode, and the second surface having a collector, drain, or cathode electrode. The semiconductor element 3, which is a switching element, may include a gate electrode on the first surface of the semiconductor substrate, and may further include a sense electrode. For example, a gate electrode 30a and an emitter electrode 30b are formed as control electrodes on the outer peripheral side of the upper surface of the semiconductor element 3. The control electrode may include both or one of the gate electrode 30a and the emitter electrode 30b. The two semiconductor elements 3 are arranged so that the gate pad 26a is sandwiched between them and the respective gate electrodes 30a face each other across the gate pad 26a. Further, the two semiconductor elements 3 are arranged so that the emitter pad 26b is sandwiched between them and the respective emitter electrodes 30b face each other across the emitter pad 26b. Further, a sense electrode 30c is formed on the outer peripheral side of the upper surface of each of the two semiconductor elements 3 that are arranged on the positive side in the Y direction in FIG. 1. That is, in the present embodiment, the two semiconductor elements 3 having the sense function are arranged on the side of the terminal members 14.

The center of the upper surface of the semiconductor element 3 and the corresponding circuit board 22 are electrically connected by a metal wiring board 5, which is a main current wiring member. The metal wiring plate 5 is formed by press working or the like using, for example, a metal material such as a copper material, a copper alloy material, an aluminum alloy material, or an iron alloy material. Specifically, the metal wiring board 5 includes a first joint portion 50 joined to the center of the upper surface of the semiconductor element 3, a second joint portion 51 joined to the corresponding circuit board 22, and a connecting portion 52 that connects the first joint portion 50 and the second joint portion 51. The shape of the metal wiring board 5 shown in FIG. 1 is merely an example and can be changed as appropriate. Further, the metal wiring board 5 may be, for example, a lead frame, a clip or a ribbon.

More specifically, for each of the two semiconductor elements 3 on the positive side in the X direction forming the upper arm, the first joining portion 50 is joined to the center of the upper surface and the second joining portion 51 is joined to the upper surface of the third circuit board 25 so that it is electrically connected to the M terminal 42 via the wiring board 5 and the third circuit board 25. For each of the two semiconductor elements 3 on the negative side in the X direction forming the lower arm, the first joining portion 50 is joined to the center of the upper surface and the second joining portion 51 is joined to the upper surface of the second circuit board 24 so that it is electrically connected to the N terminal 41 via the wiring board 5 and the second circuit board 24. These connections constitute a main circuit for one phase.

Further, the terminal members 14 and the semiconductor elements 3 are electrically connected by prescribed wiring members. Specifically, one of the inner terminal portions 15 and the gate pad 26a, and another of the inner terminal portions 15 and the emitter pad 26b are respectively connected by a wiring member W1 (first wiring member). The gate electrode 30a and the gate pad 26a, and the emitter electrode 30b and the emitter pad 26b are respectively connected by a wiring member W2 (second wiring member). That is, the gate electrode 30a and the emitter electrode 30b of the semiconductor element 3 are respectively electrically connected to the corresponding terminal members 14, which are corresponding external terminals, via the wiring members W1 and W2. Further, one of the inner terminal portions 15 and the sense electrode 30c are connected by a wiring member W3.

Conductor wires (bonding wires) are used as these wiring members. As the material of the conductor wire, any one of gold, copper, aluminum, gold alloy, copper alloy, aluminum alloy, or a combination thereof can be used. The preferred material is aluminum or an aluminum alloy. The wire diameter of the wire is 0.1 mm or more and 0.5 mm or less, preferably 0.2 mm or more and 0.4 mm or less, and more preferably 0.3 mm. It is also possible to use a member other than a conductor wire as the wiring member. For example, a ribbon can be used as the wiring member.

Further, as described above, the sealing resin 12 is filled in the internal space of the case member 11 defined by the frame-shaped wall portion 13. The sealing resin 12 is filled up to a level of the upper surface of, for example, the frame-shaped wall portion 13. As a result, the laminated substrates 2, the semiconductor elements 3, the inner terminal portions 15, the metal wiring plates 5, and the wiring members W1 to W3 are sealed by the sealing resin 12. An epoxy resin or silicone gel can be used as the sealing resin 12.

In the manufacturing process of a semiconductor device, wire bonding has been conventionally adopted as a method of electrically connecting the top electrode of a semiconductor element with a circuit board and an external terminal. Among the wire bonding methods, there is a so-called stitch bonding method in which bonding is continuously performed at a plurality of bonding points without cutting the wire at each bonding point. According to stitch bonding, bonding is continuously performed without cutting the wire in the middle, so that the bonding process can be simplified.

In a certain semiconductor device, a control circuit board is arranged between two semiconductor elements arranged side-by-side, and the top electrodes of the two semiconductor elements are continuously stitch-bonded via the circuit board. In this case, stitch bonding is performed in the order of (1) on one semiconductor element (2) on the circuit board and (3) on the other semiconductor element. That is, the bonding start position is on one semiconductor element, and the bonding end position is on the other semiconductor element.

Generally, in wire bonding, the bending angle of the wire end differs between the start position and the end position due to its convex curve shape. Specifically, at the bonding start position, since there is an operation of pulling up the wire after joining the wire tip, the bending angle of the wire becomes relatively large at the wire joining portion. On the other hand, at the bonding end position, the tip of the wire that has been pulled up earlier is pulled down toward the bonding point for bonding, so that the bending angle of the wire is relatively small (acute angle) at the wire bonding portion.

Further, as described above, the semiconductor elements and the entire bonding wires are sealed with the sealing resin. Therefore, the sealing resin may not sufficiently fill in space, and voids may remain around the joint where the bending angle of the wire is acute. The semiconductor element is a heat-generating component, and thermal stress may be concentrated on such joint portion as the semiconductor device is operated, and cracks may develop from the such a joint portion, which is problematic.

Figure 3:
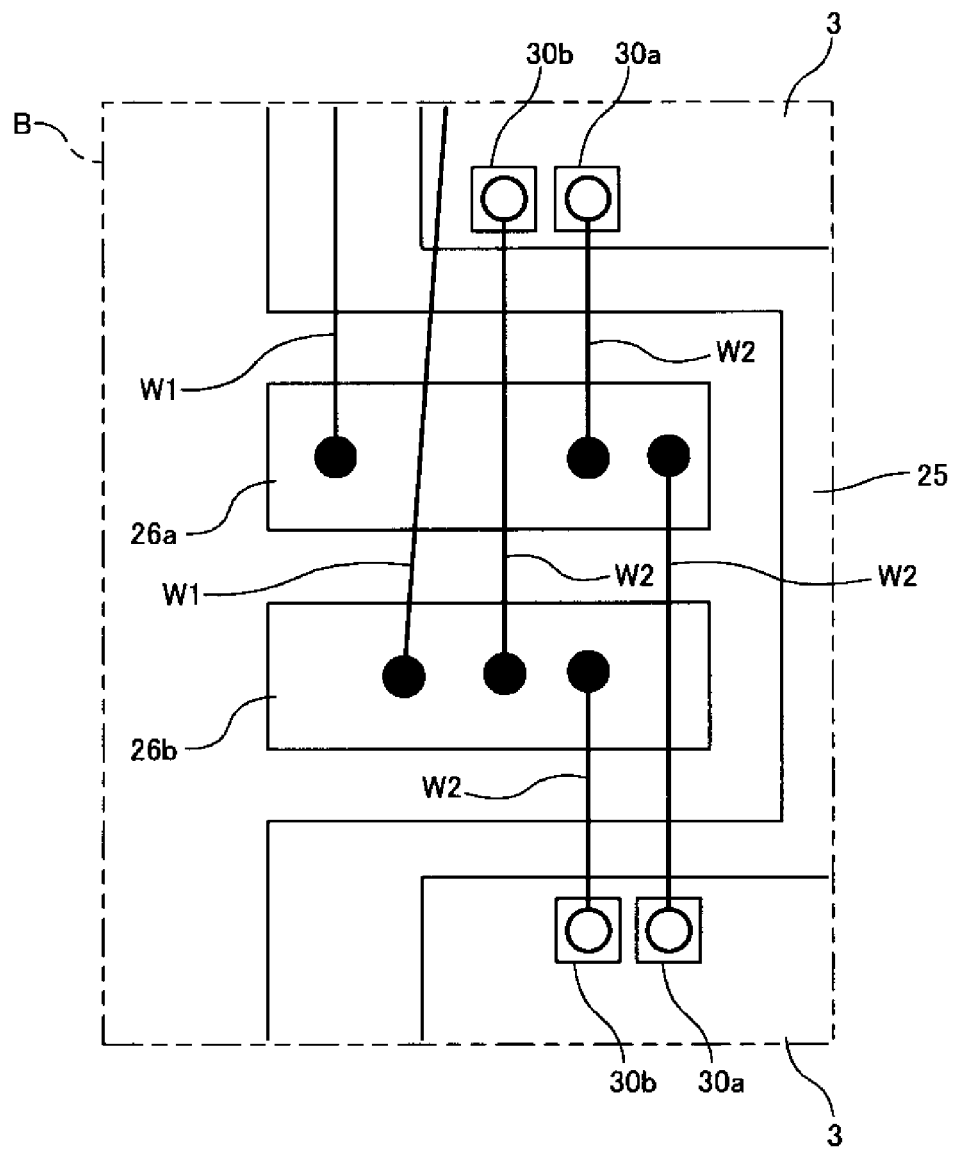
FIG. 3 is an enlarged view of the part B of FIG. 1.
Figure 4:
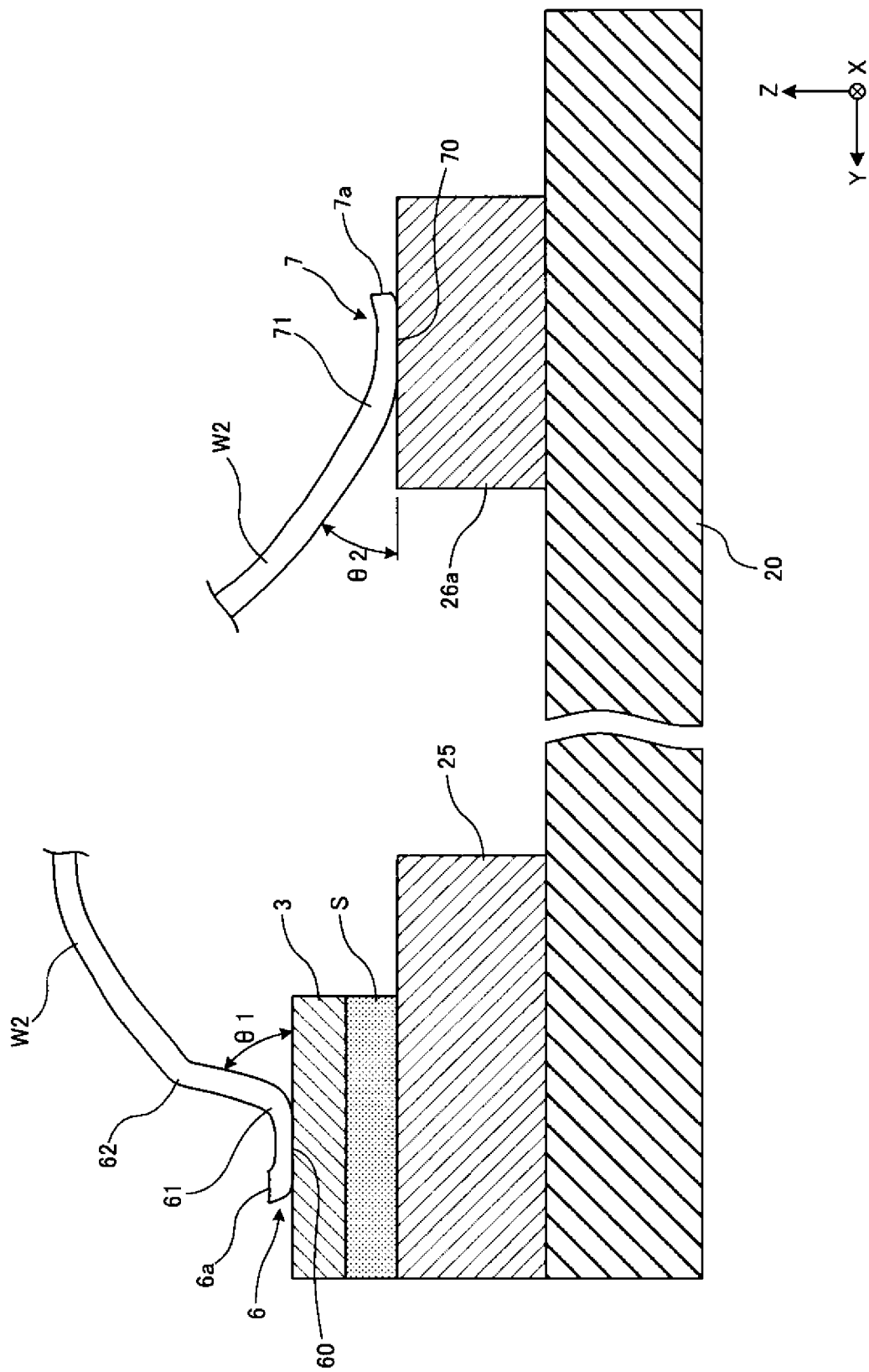
FIG. 4 is a partially enlarged view of the wire bonding part of the semiconductor module of FIG. 1.

Therefore, the present inventors have studied wire bonding by focusing on the start position and the end position of wire bonding, and have come up with the present invention. The wire structure and the wire bonding method according to an embodiment of the present invention will be described with reference to FIGS. 3 to 5. FIG. 3 is an enlarged view of a portion B of FIG. 1. FIG. 4 is a partially enlarged view of the wire bonding portions. FIG. 5 is a flow chart showing a wire bonding method. In FIG. 4, the convex curve shaped portion in the middle of the wiring member W2 is not shown for convenience of explanation. The same applies to the corresponding insulating plate 20.

In the present embodiment, as described above, the gate pad 26a and the emitter pad 26b are arranged as control circuit boards disposed between at least two semiconductor elements 3 connected in parallel. The control circuit board(s) may include both or one of the gate pad 26a and the emitter pad 26b. The terminal member 14, which is a control terminal for external connection, is connected to the gate pad 26a or the emitter pad 26b by the wiring member W1 (first wiring member). Further, the gate electrode 30a, which is a control electrode of the semiconductor element 3, is connected to the gate pad 26a by the wiring member W2 (second wiring member). The emitter electrode 30b is also connected to the emitter pad 26b by the wiring member W2.

In the present embodiment, the wiring member W2 is wire-bonded from the control electrode toward the control circuit board. That is, the start position of wire bonding is on the control electrode of the semiconductor element 3, and the end position of wire bonding is on the control circuit board. In FIG. 3, in the wiring member W2, the white circle portion on the gate electrode 30a or the emitter electrode 30b is the wire bonding start position, and the black circle portion on the gate pad 26a or the emitter pad 26b is the wire bonding end position.

As shown in FIG. 4, the wiring member W2 has a first end portion (first end) 6, which is in a start position of wire bonding and a second end portion (second end) 7, which is in an end position of wire bonding. The wiring member W2 has a first end portion 6 as a starting portion and a second end portion 7 as an ending portion. The first end portion 6 and the second end portion 7 may have a cut surface (cut end face) 6a and a cut surface (cut end face) 7a as end faces of the wiring member W2, respectively. The first end portion 6 is located on the control electrode of the semiconductor element 3, and the second end portion 7 is located on the control circuit board. That is, in the present embodiment, the start position of wire bonding is on the semiconductor element 3 side, and the end position of wire bonding is on the control circuit board side.

According to this configuration, in the wiring member W2, the bending angle $\theta 1$ of the first bent portion 61 formed by bonding the wiring member W2 to the joint portion 60 with the semiconductor element 3 and pulling it up can be set larger than the bending angle $\theta 2$ of the second bent portion 71 at the bonding end portion. The large bending angle $\theta 1$ suppresses the generation of a small gap between the first bent portion 61 and the upper surface of the semiconductor element 3, and the sealing resin 12 (see FIG. 2) can sufficiently fill in a space between the wiring member W2 and the semiconductor element 3. Therefore, it is possible to suppress the formation of voids in the gap, suppress cracks in the vicinity of the first bent portion 61 (joint portion 60), and extend the life of the semiconductor device. This effect becomes more pronounced in a semiconductor module in which a wire having a relatively large specific resistance and a large wire diameter is used as the wiring member W2.

As shown in FIG. 5, in the wire bonding method of the present embodiment, the semiconductor element 3, the circuit board 26, and the control terminal 14 are prepared (S1), and the control terminal 14 and the circuit board 26 are connected by the first wiring member W1 (S2). Then, the control electrode 30 of the semiconductor element 3 and the circuit board 26 are connected by the second wiring member W2. Either the connection S2 or the connection S3 may come first. The connection S3 further includes starting wire bonding on the control electrode 30 (S31), forming a convex curve shape in the second wiring member W2 from the control electrode 30 to the circuit board 26 (S32), and ending wire bonging on the circuit board 26 (S33).

Here, a specific flow of the wire bonding method in the present embodiment will be described. As shown in FIG. 4, first, the first end portion 6, which is the tip of the wiring member W2, is pressed on the first of the semiconductor element 3 such that the extending direction is along the surface direction of the semiconductor element 3 (Y direction in FIG. 4), and is joined thereon via heating, ultrasonic waves, etc. As a result, the joint portion 60 is formed on the upper surface of the semiconductor element 3. As described above, in the joint portion 60, the extending direction of the wiring member W2 and the plane direction (Y direction) of the semiconductor element 3 (control electrode) are parallel. The upper surface of the semiconductor element 3 and the control electrode may be substantially parallel to each other. In the present embodiment, the cut surface 6a of the first end portion 6 is directed upward.

Next, the first bent portion 61 is formed on the rear end side of the joint portion 60 by pulling the leading end of the wiring member W2 upward while extending the wiring member W2 from the tip (not shown) of the bonding device. The tip of the bonding apparatus may be, for example, a wedge bonding tool. The angle formed by the wiring member W2 raised by the first bent portion 61 on the rear end side of the joint portion 60 and the upper surface of the semiconductor element 3 on the rear end side of the joint portion 60 is the bending angle $\theta 1$ of the first bent portion 61.

Next, in order to set the overall convex curve shape of the wiring member W2, a convex curve starting bent portion 62, which is the starting point of the convex curve shape, is formed. The convex curve starting bent portion 62 is formed by drawing out the wiring member W2 from the tip of the bonding device and pulling the tip back to the positive side in the Y direction to form a curve (bend) in the middle of the wiring member W2. The convex curve starting bent portion 62 is formed at a position above the first bent portion 61 and close to the first bent portion 61.

Next, the tip of the bonding apparatus is moved toward the control circuit board (gate pad 26a in FIG. 4), which is the bonding destination. The tip of the bonding device is pulled down above the gate pad 26a while forming a convex curve shape of the wiring member W2. Then, the wiring member W2 is pressed against the upper surface of the gate pad 26a, and is joined thereon by heating, ultrasonic waves, or the like. Then, the end portion of the wiring member W2 is cut. As a result, the second end portion 7, the joint portion 70, and the second bent portion 71 are formed on the upper surface of the gate pad 26a.

At the joint portion 70, the extending direction of the wiring member W2 and the surface direction (Y direction) of the gate pad 26a are parallel. Further, the angle formed by the wiring member W2 inclined on the front side (positive side in the Y direction) of the joint portion 70 and the upper surface of the gate pad 26a on the front side of the joint portion 70 is the bending angle $\theta 2$ of the second bent portion 71. As described above, the bending angle $\theta 1$ is larger than the bending angle $\theta 2$. Further, the cut surface 7a of the second end portion 7 is directed to the side (negative side in the Y direction).

In the wiring structure formed in this way, the control electrodes (gate electrodes 30a and/or emitter electrodes 30b) formed on the upper surface of the semiconductor element 3 are arranged at one side on the outer peripheral side of the semiconductor element 3 (FIG. 1). Further, in the wiring member W2, the bonding direction from the first end portion 6 to the second end portion 7 is directed to the outer peripheral side of the semiconductor element 3. Here, the bonding direction means a direction in which the tip of the bonding device is directed from the bonding start position to the bonding end position. In the present embodiment shown in FIG. 4, the bonding direction indicates the direction on the negative side in the Y direction from the semiconductor element 3 toward the control circuit board 26a.

With this configuration, the first end portion 6 is located near the outer peripheral edge of the semiconductor element 3, and the wiring member W2 does not straddle the center of the upper surface of the semiconductor element 3. The semiconductor element 3 tends to generate heat at the central portion (the portion where the metal wiring board 5 is joined) rather than the outer peripheral side. Therefore, by locating the first end portion 6 (joint portion 60) on the outer peripheral portion that is relatively less susceptible to heat, cracks are less likely to occur in the joint portion 60, and the life of the semiconductor device can be extended.

Further, in the present embodiment, the first end portion 6 is provided at a position higher than the second end portion 7, and the first end portion 6 is farther separated from the insulating plate 20 than the second end portion 7. According to this configuration, when wiring the wiring member W2, it is possible to secure a large vertical traveling distance when operating the tip of the bonding device. As a result, the bending angle $\theta 1$ of the first bent portion 61 becomes large, and it is possible to secure a large gap for filling the sealing resin 12 between the first bent portion 61 and the upper surface of the semiconductor element 3. Therefore, it is possible to improve the crack suppressing effect in the vicinity of the first bent portion 61.

Further, in the present embodiment, the wiring member W2 has an upwardly convex curve shape between the first end portion 6 and the second end portion 7. The convex curve shape of the wiring member W2 may draw a substantial arc in the direction away from the insulating plate 20. Further, the wiring member W2 has a first bent portion 61 formed on the first end portion 6 side and a second bent portion 71 formed on the second end portion 7 side. Further, the bending angle $\theta 1$ of the first bending portion 61 is larger than the bending angle $\theta 2$ of the second bending portion 71. With this configuration, as described above, on the semiconductor element 3 side where more heat is generated relatively, it is possible to secure a large gap for filling the sealing resin 12 in the vicinity of the joint portion 60. Therefore, it is possible to improve the crack suppressing effect in the vicinity of the joint portion 60 (first bent portion 61).

Further, in the present embodiment, the wiring member W2 further has a convex curve starting bent portion 62 as a starting point for defining the convex curve shape. The convex curve starting bent portion 62 is formed on the side of the first bending portion 61. With this configuration, the convex curve shape of the wiring member W2 can be appropriately formed by forming the convex curve starting bent portion 62. Further, by forming the convex curve starting bent portion 62 in the vicinity of the first bending portion 61, it is possible to clearly identify the position of the first end portion 6, which is the start position of wire bonding.

Further, in the present embodiment, the cut surface 6a of the first end portion 6 is directed upward, and the cut surface 7a of the second end portion 7 is directed sideways. According to this configuration, it is possible to clearly identify the start position of wire bonding and the end position of wire bonding.

As described above, in the present embodiment, the wire bonding start position is set on the semiconductor element 3 side, and the wire bonding end position is set on the control circuit board side. Therefore, it is possible to extend the life by suppressing cracks in the vicinity of the wire bonding portion.

Further, in the above embodiment, the number and the arrangement location of the semiconductor elements 3 are not limited to the above configuration, and can be appropriately changed.

Further, in the above embodiment, the number and layout of the circuit boards are not limited to the above configuration and can be changed as appropriate.

Further, in the above embodiment, the laminated substrate 2 and the semiconductor element 3 are formed in a rectangular or square shape in a plan view, but the configuration is not limited to this. The laminated substrate 2 and the semiconductor element 3 may be formed in a polygonal shape other than the above.

Further, in the above embodiment, the case where the bonding material S is composed of solder has been described, but the present invention is not limited to this configuration. The bonding material may be composed of, for example, a sintered material.

Further, in the above embodiment, the case where two circuit boards for the gate pad 26a and the emitter pad 26b, respectively, are provided side by side as the control circuit boards has been described, but the present invention is not limited to this configuration. The gate pad 26a and the emitter pad 26b may be formed of an integral circuit board.

Moreover, although the present embodiment and the modified examples have been described, as another embodiment, the above-described embodiment and the modified examples may be combined in whole or in part.

Further, the present invention is not limited to the above-described embodiments and modifications, and may be variously modified, replaced, or modified without departing from the spirit of the technical idea. Furthermore, if the technical idea can be realized in another way by the advancement of technology or another technology derived from it, it may be carried out by that technology. Therefore, the claims cover all embodiments that may be included within the scope of the technical idea.

Some of the features of the embodiments described above are repeated below using similar or same language.

In one aspect of the present invention, a semiconductor module may include at least two semiconductor elements connected in parallel, a circuit board arranged between the two semiconductor elements, a control terminal for external connection, a first wiring member for connecting the circuit board and one of the two semiconductor elements, a second wiring member for connecting a control electrode of one of the semiconductor elements and the circuit board. The second wiring member is wire-bonded from the control electrode toward the circuit board, and has a first end portion which is a start position of wire bonding and a second end portion which is an end position of wire bonding. The first end portion is located on the control electrode and the second end portion is located on the circuit board.

In the above semiconductor module, the control electrode may be arranged on the outer peripheral side of the semiconductor element, and the bonding direction from the first end portion to the second end portion may be outward from the outer peripheral side of the semiconductor element.

Further, in the above semiconductor module, the first end portion may be provided at a position higher than the second end portion.

Further, in the above semiconductor module, the second wiring member may have an upwardly convex curve shape between the first end portion and the second end portion on the first end portion side. The second wiring member further may have a first bent portion in the first end portion and a second bent portion in the second end portion, and the bending angle of the first bent portion may be larger than the bending angle of the second bent portion.

Further, in the above semiconductor module, a sealing resin may be filled in a gap between the first bent portion and the semiconductor element.

Further, in the above semiconductor module, the second wiring member may further have a convex curve starting bent portion serving as a starting point for defining the convex curve shape on the side of the first bending portion.

Further, in the above semiconductor module, the cut surface of the first end portion may face upward, and the cut surface of the second end portion may face sideways.

In another aspect, the present disclosure provide a method of wire-bonding a semiconductor module that includes at least two semiconductor elements connected in parallel, a circuit board arranged between the two semiconductor elements, a control terminal for external connection, a first wiring member connecting the control terminal and the circuit board, a second wiring member connecting a control electrode of one of the semiconductor elements and the circuit board. In the connection by the second wiring member, wire bonding is started on the control electrode, a convex curve shape of the second wiring member is formed from the control electrode toward the circuit board, and wire bonding is completed on the circuit board.

In the above wire bonding method, when forming the convex curve shape of the second wiring member between the start position and the end position, a convex curve starting bent portion serving as a starting point of the convex curve shape may be formed on the starting position side.

Further, in the above wire bonding method, after the connection by the second wiring member, the second wiring member may have an end face on the control electrode side and an end face on the circuit board side. The end face on the control electrode side may face upward, and the end face on the circuit board side may face sideways.

As described above, the present invention has the effect of suppressing cracks in the vicinity of the wire bonding portion and extending the service life, and is particularly useful for semiconductor modules and wire bonding methods.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor module, comprising:
   at least two semiconductor elements connected in parallel;
   a control circuit board placed between the at least two semiconductor elements;
   a control terminal for external connection;
   a first wiring member that connects the control terminal and the control circuit board; and a second wiring member that connects a control electrode of one of the at least two semiconductor elements and the control circuit board, wherein the second wiring member is wire-bonded from the control electrode towards the control circuit board, and has a first end on the control electrode and a second end on the control circuit board, the first end having a cut end face facing upward normal to a surface of the control electrode and the second end having a cut end face facing sideways parallel to a surface of the control circuit board, and wherein the second wiring member has a convex curve shape between the first end and the second end that is convex upwardly, and further has a first bent portion in the first end and a second bent portion in the second end, a bending angle of the first bent portion being larger than a bending angle of the second bent portion.

2. The semiconductor module according to claim 1, wherein the control electrode is arranged on an outer peripheral portion of the one of the at least two the semiconductor elements, and wherein the second wiring member extends from the control electrode towards the control circuit board farther outwardly from the outer peripheral portion of the one of the at least two the semiconductor elements.

3. The semiconductor module according to claim 1, wherein the first end is provided at a position higher than the second end.

4. The semiconductor module according to claim 1, wherein a gap between the first bent portion and the semiconductor element is filled with a sealing resin.

5. The semiconductor module according to claim 4, wherein the second wiring member further has a convex curve starting bent portion that serves as a starting point for defining the convex curve shape on a side of the first bent portion.

6. A method of wire bonding a semiconductor module that includes at least two semiconductor elements connected in parallel, a control circuit board arranged between the two semiconductor elements, and a control terminal for external connection, the method comprising:

connecting the control terminal and the control circuit board with a first wiring member; and connecting a control electrode of one of the at least two semiconductor elements and the control circuit board by a second wiring member, wherein the connecting of the control electrode and the control circuit board by the second wiring member includes: starting wire-bonding of the second wiring member on the control electrode, forming a convex curve shape of the second wiring member extending from on the control electrode towards the control circuit board, and thereafter, ending the wire-bonding of the second wiring member on the control circuit board.

7. The method according to claim 6, wherein the forming of the convex curve shape of the second wiring member includes forming a convex curve starting bent portion that serves as a starting point for defining the convex curve shape adjacent to the control electrode.

8. The method according to claim 6, wherein after connecting the control electrode of the one of the at least two semiconductor elements and the control circuit board by the second wiring member, the second wiring member has a first end on the control electrode and a second end on the control circuit board, the first end having a cut end face facing upward normal to a surface of the control electrode and the second end having a cut end face facing sideways parallel to a surface of the control circuit board.

* * * * *